United States Patent
Kim et al.

(10) Patent No.: US 8,445,357 B2
(45) Date of Patent: May 21, 2013

(54) METHOD OF FABRICATING SEMICONDUCTOR INTEGRATED CIRCUIT DEVICE AND SEMICONDUCTOR INTEGRATED CIRCUIT DEVICE FABRICATED USING THE METHOD

(75) Inventors: Yong-Don Kim, Hwaseong-si (KR);
Eung-Kyu Lee, Seoul (KR);
Sung-Ryoul Bae, Hwaseong-si (KR);
Soo-Bang Kim, Seoul (KR); Dong-Eun Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 326 days.

(21) Appl. No.: 12/798,133

(22) Filed: Mar. 30, 2010

(65) Prior Publication Data
US 2011/0241171 A1    Oct. 6, 2011

(51) Int. Cl.
*H01L 29/06* (2006.01)

(52) U.S. Cl.
USPC ........... 438/451; 438/414; 438/416; 438/419; 438/510; 438/526; 257/544

(58) Field of Classification Search ............ 257/500, 257/501, 544, 550, E21.544, E29.019, E29.256, 257/E21.417, E21.418; 438/414, 416, 419, 438/451, 510, 526
See application file for complete search history.

(56) References Cited

U.S. PATENT DOCUMENTS

| 5,386,136 A | 1/1995 | Williams et al. |
| 5,698,458 A * | 12/1997 | Hsue et al. ............ 438/451 |
| 2009/0267148 A1 * | 10/2009 | Kim et al. ............ 257/337 |

FOREIGN PATENT DOCUMENTS

| JP | 2002313948 | 10/2002 |
| KR | 1020030070264 | 8/2003 |

* cited by examiner

*Primary Examiner* — Daniel Whalen
*Assistant Examiner* — Suberr Chi
(74) *Attorney, Agent, or Firm* — Onello & Mello, LLP (57) ABSTRACT

Provided are a method of fabricating a semiconductor integrated circuit device and a semiconductor integrated circuit device fabricated using the method. The method includes: forming a mask film, which exposes a portion of a substrate, on the substrate; forming a first buried impurity layer, which contains impurities of a first conductivity type and of a first concentration, in a surface of the exposed portion of the substrate by using the mask film; removing the mask film; forming a second buried impurity layer, which contains impurities of a second conductivity type and of a second concentration, using blank implantation; and forming an epitaxial layer on the substrate having the first and second buried impurity layers, wherein the first concentration is higher than the second concentration.

18 Claims, 12 Drawing Sheets

METHOD OF FABRICATING SEMICONDUCTOR INTEGRATED CIRCUIT DEVICE AND SEMICONDUCTOR INTEGRATED CIRCUIT DEVICE FABRICATED USING THE METHOD

BACKGROUND

1. Field of the Invention

The present invention relates to a method of fabricating a semiconductor integrated circuit device and a semiconductor integrated circuit device fabricated using the method.

2. Description of the Related Art

A semiconductor integrated circuit device, such as a system on chip (SOC), a microcontroller unit (MCU) or a display driver integrated circuit (DDI), has a plurality of peripheral devices including a processor, a memory, a logic circuit, a voice and image processing circuit, various interface circuits, etc. Therefore, the process of fabricating a semiconductor integrated circuit device is complicated, and many masks are used.

SUMMARY

Aspects of the present invention provide a method of fabricating a semiconductor integrated circuit device, the method capable of improving the current driving capability of device without using a mask.

Aspects of the present invention also provide a semiconductor integrated circuit device fabricated using the method.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a method of fabricating a semiconductor integrated circuit device. The method includes: forming a mask film, which exposes a portion of a substrate, on the substrate; forming a first buried impurity layer, which contains impurities of a first conductivity type and of a first concentration, in a surface of the exposed portion of the substrate by using the mask film; removing the mask film; forming a second buried impurity layer, which contains impurities of a second conductivity type and of a second concentration, using blank implantation; and forming an epitaxial layer on the substrate having the first and second buried impurity layers, wherein the first concentration is higher than the second concentration.

According to another aspect of the present invention, there is provided a method of fabricating a semiconductor integrated circuit device. The method includes: preparing a substrate in which a first region and a second region are defined; forming a first buried impurity layer of a first conductivity type, a second buried impurity layer of a second conductivity type which is different from the first conductivity type, and a third buried impurity layer of the second conductivity type in a surface of the substrate; and forming an epitaxial layer on the substrate having the first through third buried impurity layers, wherein the first buried impurity layer is formed in the first region, the third buried impurity layer is formed in the second region, and the second buried impurity layer overlaps the third buried impurity layer.

According to another aspect of the present invention, there is provided a semiconductor integrated circuit device including: a substrate in which a first region and a second region are defined; first through third buried impurity regions formed in a surface of the substrate; and an epitaxial layer formed on the substrate having the first through third buried impurity layers, wherein the first buried impurity layer has a first conductivity type while the second and third buried impurity layers have a second conductivity type, and the first buried impurity layer is formed in the first region, the third buried impurity layer is formed in the second region, and the second buried impurity layer overlaps the third buried impurity layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. Like numbers refer to like elements throughout.

Embodiments of the invention are described herein with reference to (plan and) cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

The invention is described more fully hereinafter with reference to the accompanying drawings, in which exemplary embodiments of the invention are shown.

A semiconductor integrated circuit device according to exemplary embodiments of the present invention will be described using a plasma display panel (PDP) data driver integrated circuit (IC) among display driver ICs. However, the scope of the present invention is not limited to the PDP data driver IC. It is obvious to those of ordinary skill in the art that the present invention is also applicable to a semiconductor integrated circuit device such as a system on chip (SOC) or a microcontroller unit (MCU).

Figure 1:
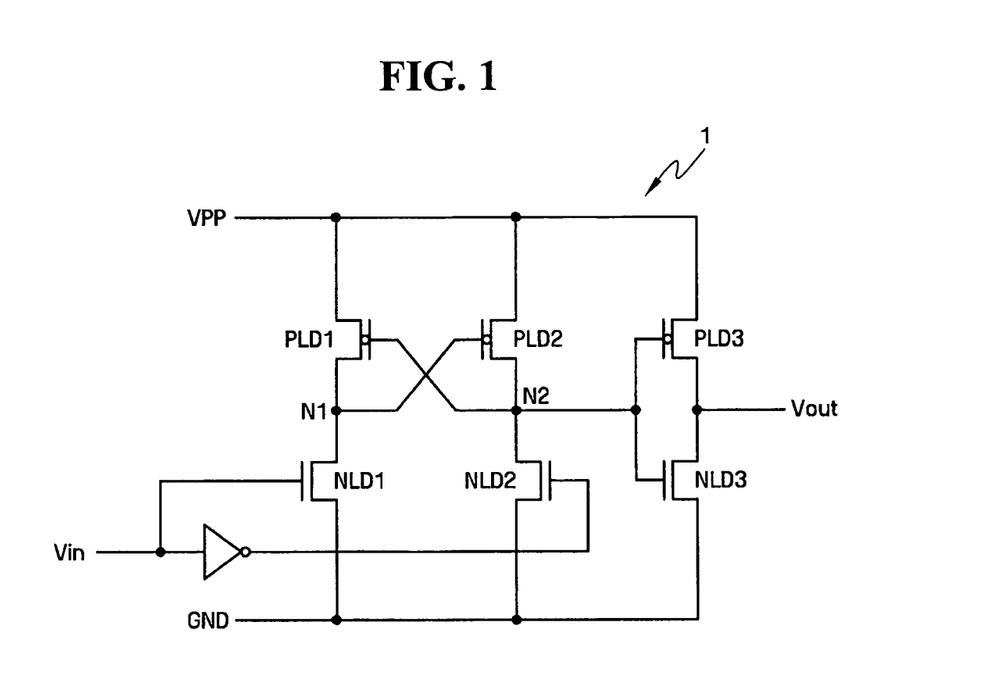
FIG. 1 is a circuit diagram of a semiconductor integrated circuit device according to exemplary embodiments of the present invention.

FIG. 1 is a circuit diagram of a semiconductor integrated circuit device 1 according to exemplary embodiments of the present invention. The exemplary circuit diagram of FIG. 1 is an output driver schematic of a PDP data driver IC.

Referring to FIG. 1, the semiconductor integrated circuit device 1 according to the exemplary embodiments of the present invention may include a plurality of pull-up transistors PLD1 through PLD3 and a plurality of pull-down transistors NLD1 through NLD3.

A driving voltage VPP used in a display driver IC is considerable high. For example, the driving voltage VPP may be approximately 50 to 70 V or, in some cases, higher than 100 V. Accordingly, the pull-up transistors PLD 1 through PLD3 and the pull-down transistors NLD1 through NLD3 may be constructed as high-voltage transistors of a second conductivity type (e.g., a p type) and high-voltage transistors of a first conductivity type (e.g., an n type), respectively.

An input voltage Vin has a logic voltage, and the semiconductor integrated circuit device 1 receives the input voltage Vin and generates a considerably high output voltage Vout which is used by an external circuit.

Specifically, the level of the input voltage Vin determines voltage values of a first node N1 and a second node N2. That is, a high input voltage Vin results in a low voltage value of the first node N1, a high voltage value of the second node N2, and a low output voltage Vout. On the other hand, a low input voltage Vin results in a low voltage value of the second node N2, a high voltage value of the first node N1, and a high output voltage Vout.

Figure 2:
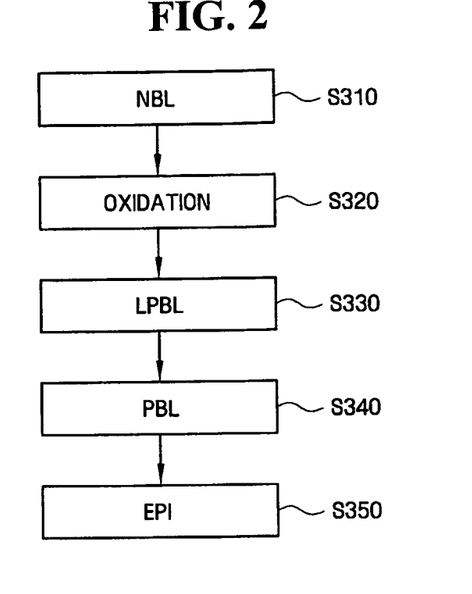
FIG. 2 is a flowchart illustrating a method of fabricating a semiconductor integrated circuit device according to an exemplary embodiment of the present invention.

FIG. 2 is a flowchart illustrating a method of fabricating a semiconductor integrated circuit device according to an exemplary embodiment of the present invention. FIGS. 3 through 8 are diagrams respectively illustrating intermediate processes included in a method of fabricating a semiconductor integrated circuit device according to an exemplary embodiment of the present invention.

Figure 3:
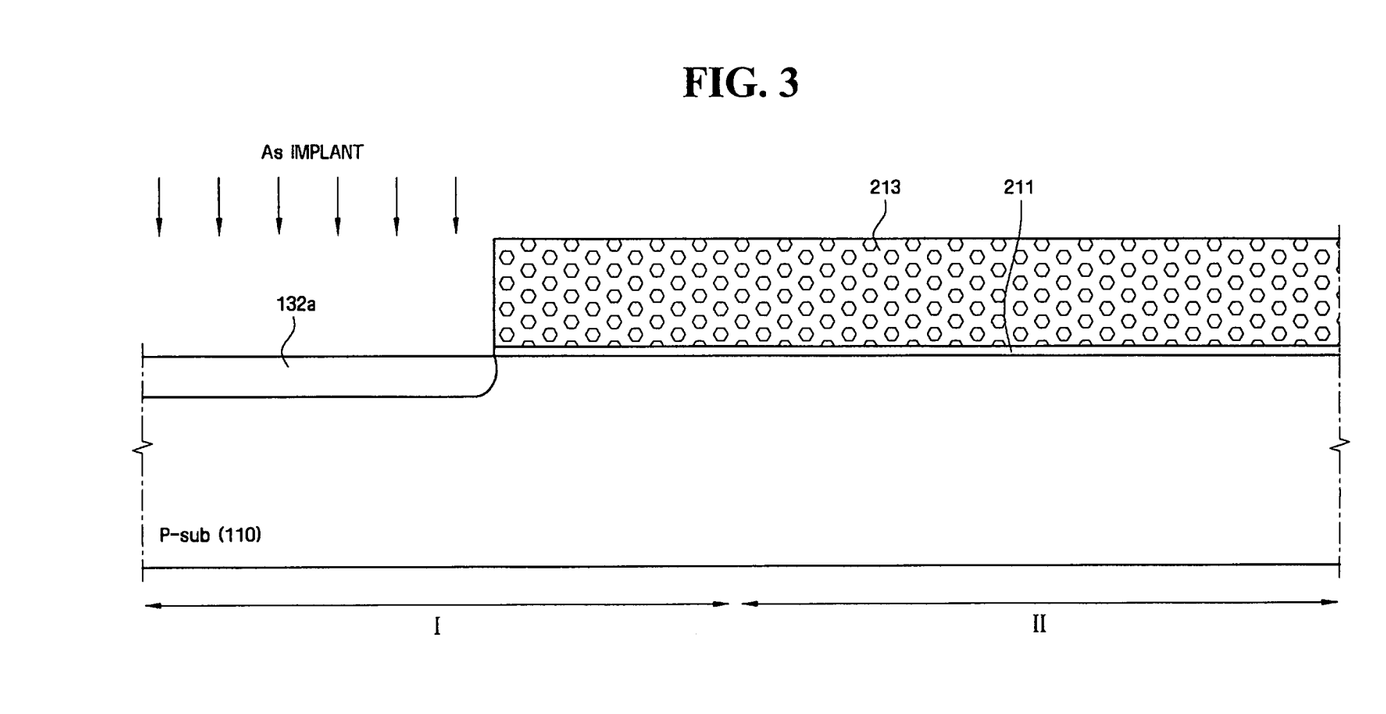
FIGS. 3 through 8 are diagrams respectively illustrating intermediate processes included in the fabrication method of FIG. 2.

Referring to FIGS. 2 and 3, a first region I and a second region II are defined in a substrate 110. Here, the first region I is a region where a second high-voltage transistor PLD (see FIG. 9) of a second conductivity type (e.g., a p type) is formed, and the second region II is a region where a first high-voltage transistor NLD (see FIG. 9) of a first conductivity type (e.g., an n type) is formed. The first and second high-voltage transistors NLD and PLD may be, but are not limited to, lateral double-diffused metal oxide semiconductor (DMOS) transistors.

The substrate 100 may be a silicon substrate, a gallium arsenic substrate, a silicon germanium substrate, a ceramic substrate, a quartz substrate, a display glass substrate, or a semiconductor on insulator (SOI) substrate.

A nitride layer 211 and a mask film 213 which expose a portion of the substrate 110 are formed on the substrate 110. Then, impurities of the first conductivity type (e.g., the n type) are implanted into a surface of the exposed portion of the substrate 110 at a first dose by using the nitride layer 211 and the mask film 213. As a result, a first buried impurity layer 132a of a first concentration is formed in the first region I of the substrate 110 (operation S310).

Examples of the impurities of the first conductivity type include arsenic (As), phosphorous (P) and antimony (Sb), and the first dose may be 1e14 atoms/cm^2 or higher. Specifically, arsenic may be implanted at a dose of 1e15 to 10e15 atoms/cm^2.

Figure 4:
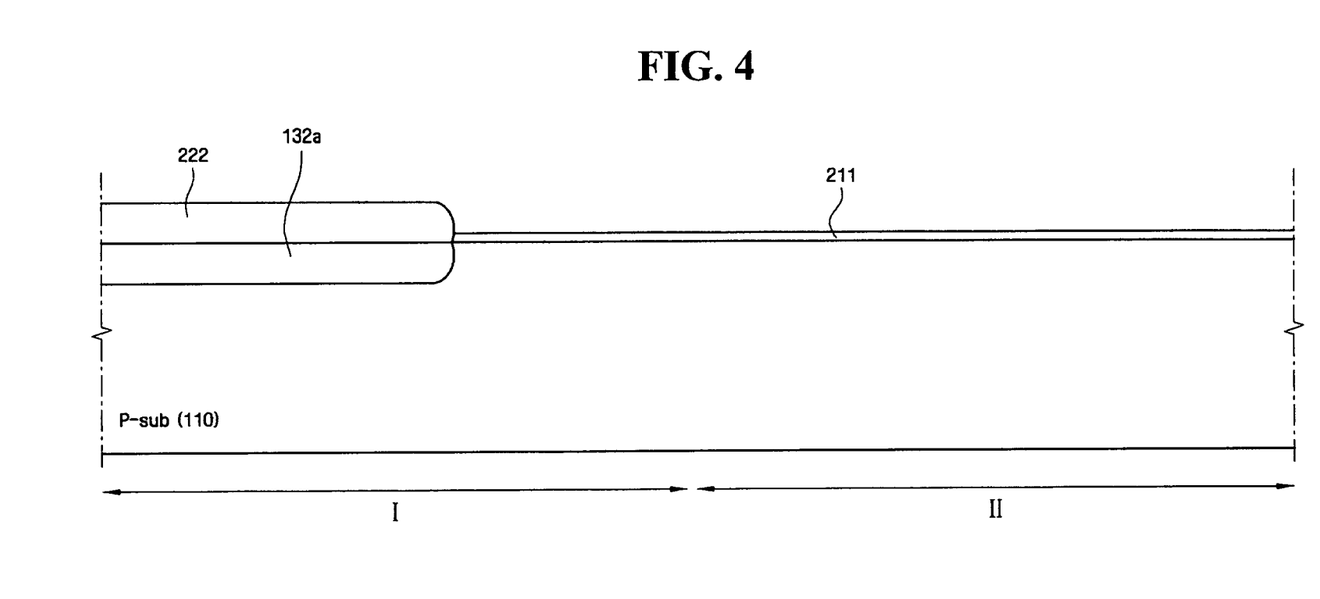

Referring to FIGS. 2 and 4, the mask film 213 is removed. Then, a passivation layer 222 is formed on the first buried impurity region 132a by oxidation (operation S320).

Here, since a portion of the substrate on which the nitride layer 211 is formed is not oxidized, the passivation layer 222 is not formed on this portion of the substrate 110.

The passivation layer 222 protects the first buried impurity layer 132a during blank implantation which will be described later. Accordingly, the passivation layer 222 should be formed to a thickness that can prevent penetration of impurities used in blank implantation into the first buried impurity layer 132a.

Next, the nitride layer 211 is removed.

Figure 5:
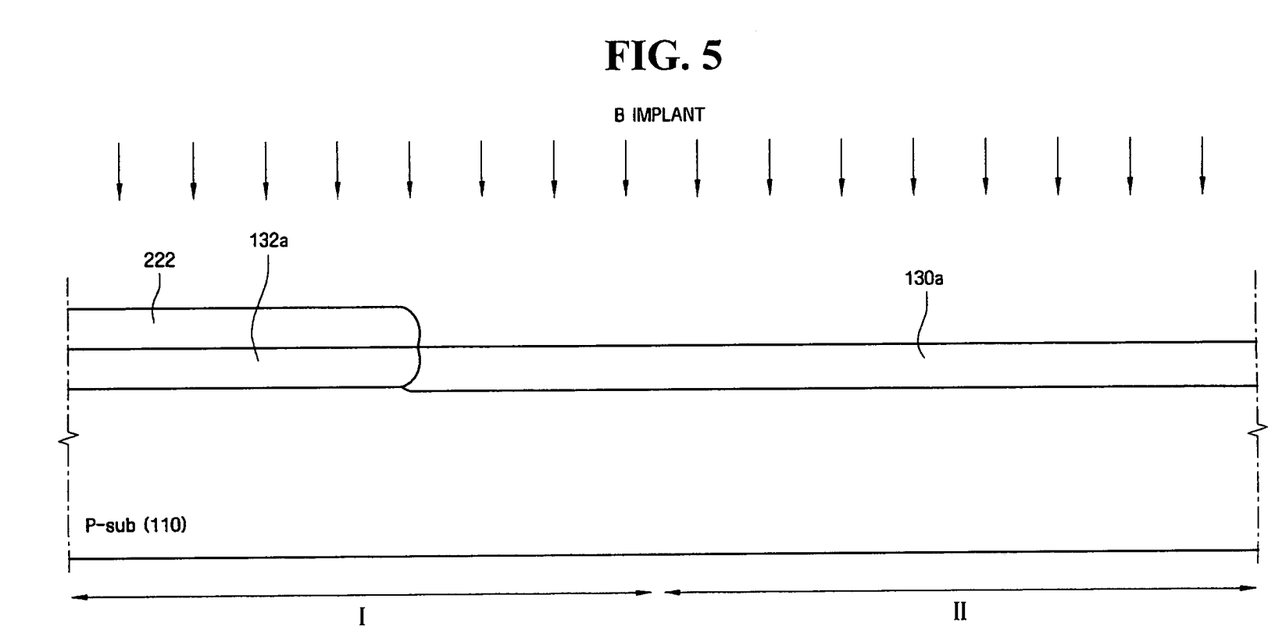

Referring to FIGS. 2 and 5, impurities of the second conductivity type (e.g., the p type) are implanted at a second dose using blank implantation. As a result, a second buried impurity region 130a of a second concentration is formed (operation S330).

Blank implantation is the process of implanting impurities into the entire surface of the substrate 110 by using a structure formed on the substrate without using a separate photoresist mask.

An example of the impurities of the second conductivity type includes boron (B), and the second dose is lower than the first dose. Since the second dose is lower than the first dose, the second concentration may be lower than the first concentration. Specifically, boron may be implanted with an energy of 10 to 150 KeV and a dose of 1e12 to 6e12 atoms/cm^2.

Since blank implantation is performed after the passivation layer 222 is formed on the first buried impurity layer 132a, the impurities of the second conductivity type may not penetrate into the first buried impurity layer 132a.

Figure 6:
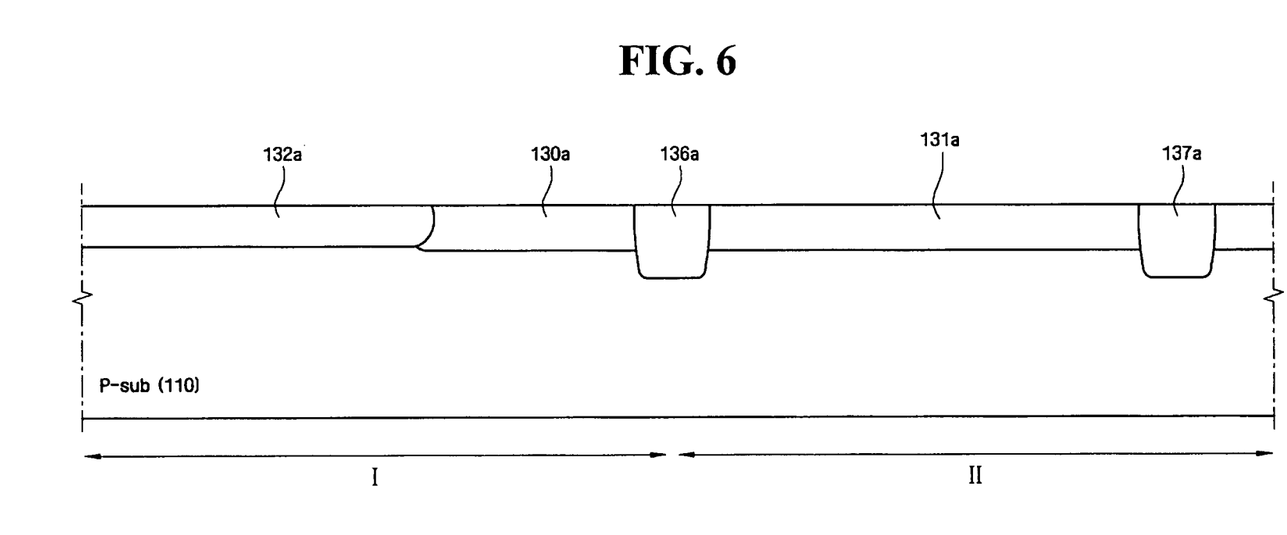

Referring to FIGS. 2 and 6, the passivation layer 222 is removed. Then, the impurities of the second conductivity type (e.g., the p type) are implanted at a third dose. As a result, third buried impurity layers 136a and 137a of a third concentration are formed (operation S340).

The third dose may be higher than the second dose and may be 1e14 atoms/cm^2 or higher. Specifically, boron may be implanted at a dose of 1e14 to 10e14 atoms/cm^2.

The third buried impurity layers 136a and 137a may be separated from the first buried impurity layer 132a and overlap the second buried impurity layers 130a and 131a. Accordingly, as shown in FIG. 6, the second buried impurity layer 130a may be disposed between the first buried impurity layer 132a and the third buried impurity layer 136a, and the second buried impurity layer 131a may be disposed between the neighboring third buried impurity layers 136a and 137a.

Figure 7:
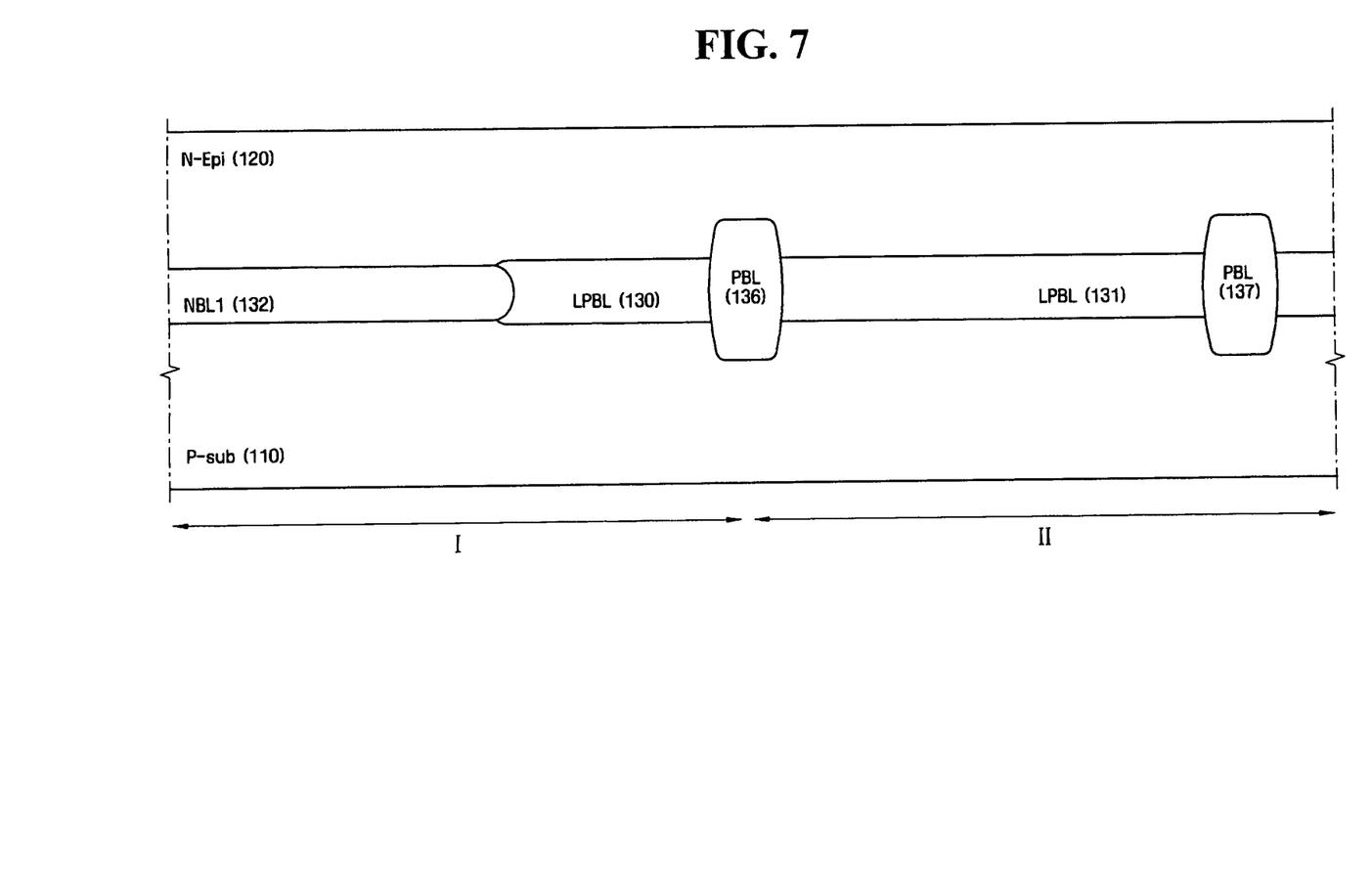

Referring to FIGS. 2 and 7, an epitaxial layer 120 is formed on the substrate 110 having the first buried impurity layer 132a, the second buried impurity layers 130a and 131a, and the third buried impurity layers 136a and 137a (operation S350).

The epitaxial layer 120 may be grown at a high temperature of approximately 1000 to 1200 °C. and a velocity of approximately 1 to 3 μm/min. The epitaxial layer 120 may be of the first conductivity type (e.g., the n type) and may be formed at a low concentration of e.g., 0.1e15 to 7e15 atoms/cm^3.

During the formation of the epitaxial layer 120, the first buried impurity layer 132a, the second buried impurity layers 130a and 131a, and the third buried impurity layers 136a and 137a may be diffused to the epitaxial layer 120, thereby forming a first buried impurity layer 132, second buried impurity layers 130 and 131, and third buried impurity layers 136 and 137. The first buried impurity layer 132a, the second buried impurity layers 130a and 131a, and the third buried impurity layers 136a and 137a may be diffused to the epitaxial layer 120 not only during the formation of the epitaxial layer 120 but also during subsequent processes performed at high temperatures.

Figure 8:
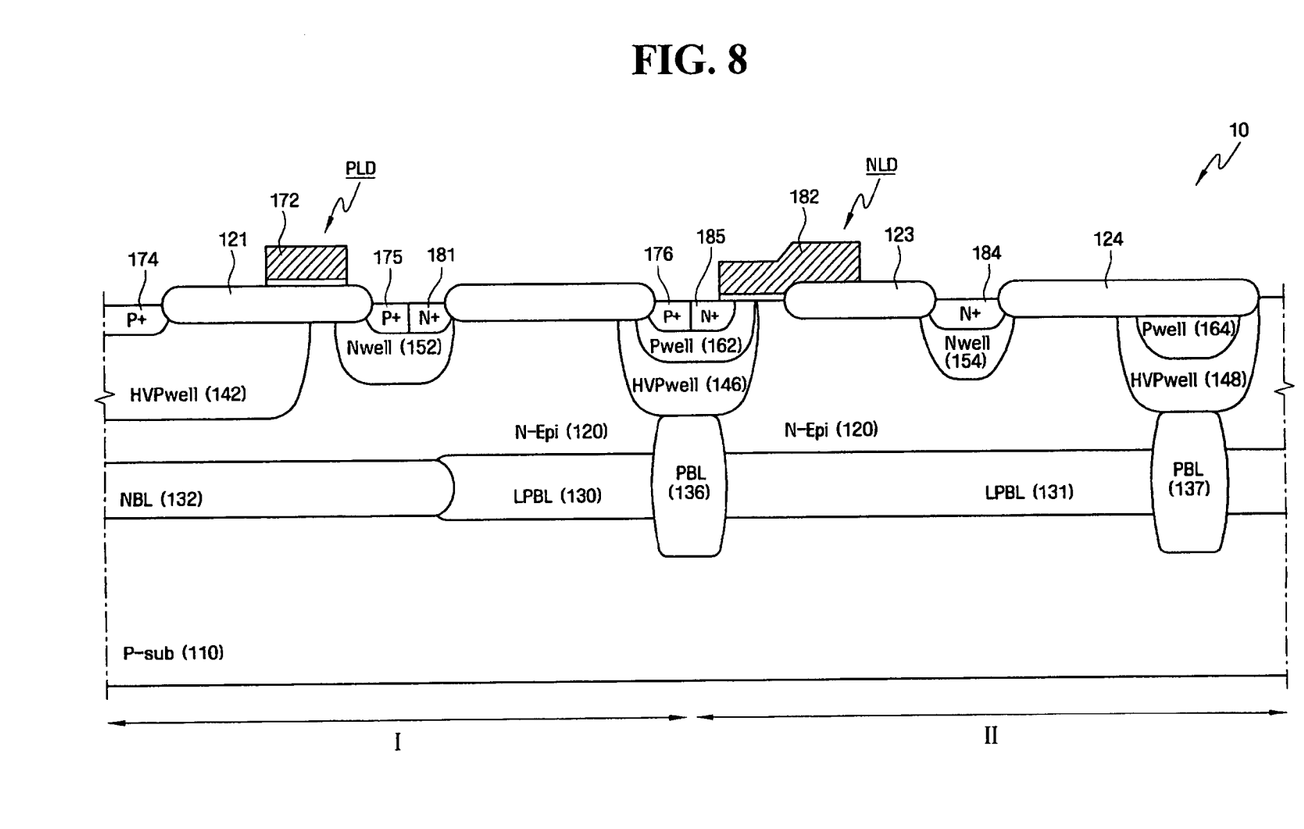

Referring to FIGS. 2 and 8, the first high-voltage transistor NLD of the first conductivity type (e.g., the n type) is formed on the epitaxial layer 120 in the second region II, and the second high-voltage transistor PLD of the second conductivity type (e.g., the p type) is formed on the epitaxial layer 120 in the first region I.

Specifically, the first high-voltage transistor NLD may be a DMOS transistor as described above and may include a high-voltage insulating film 123, a gate electrode 182, a drain 184, and a source 185. The drain 184 may be formed in a first well 154 of the first conductivity type and have a higher concentration than the first well 154 of the first conductivity type. In addition, the source 185 may be formed in a second well 162 of the second conductivity type, and the second well 162 may be formed in a first high-voltage well 146 of the second conductivity type. Here, the first high-voltage well 146 may contact the third buried impurity layer 136. The first high-voltage well 146 and the third buried impurity layer 136 isolate the first region I from the second region II. That is, the first high-voltage well 146 and the third buried impurity layer 136 form an electrical isolation region.

The second may be a DMOS transistor as described above and may include a high-voltage insulating film 121, a gate electrode 172, a drain 174, and a source 175. The drain 174 may be formed in a second high-voltage well 142 and have a higher concentration than the second high-voltage well 142. The second high-voltage well 142 functions as a drift region. Accordingly, a drift region and a channel region exist between the drain 174 and the source 175 of the second high-voltage transistor PLD. The drift region is essential for securing a breakdown voltage for a high voltage. The second high-voltage well 142 is separated from the first buried impurity region 132. In addition, the source 175 may be formed in a third well 152 of the first conductivity type. A first ohmic contact 181 is formed in the third well 152 to contact the source 175 of the second high-voltage transistor PLD.

A fourth well 164 of the second conductivity type is formed under an insulating film 124 and in a third high-voltage well 148 of the second conductivity type. The third high-voltage well 148 may be formed to contact the third buried impurity layer 137. The third high-voltage well 148 and the third buried impurity layer 137 form an electrical isolation region.

Figure 9:
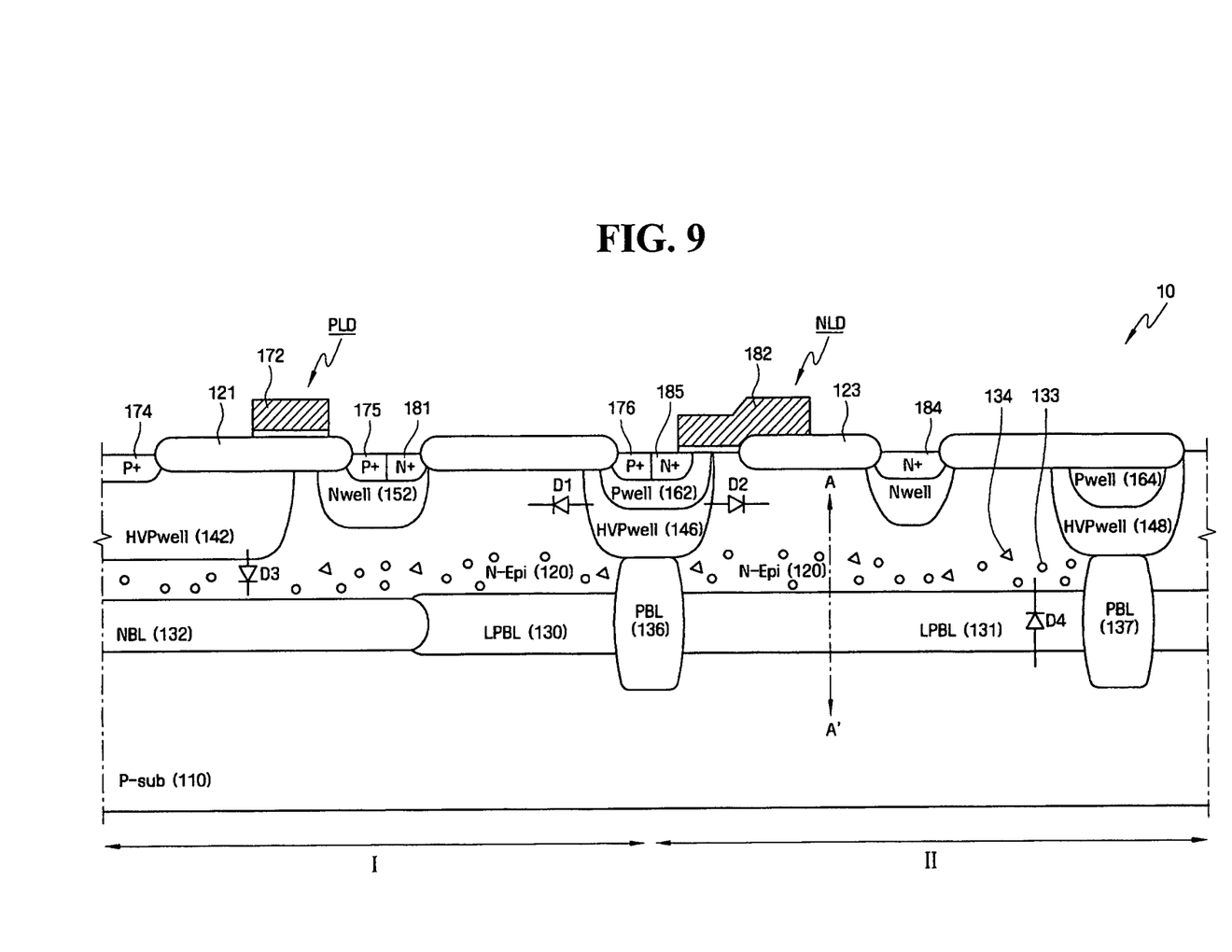
FIG. 9 is a diagram for explaining effects of the fabrication method of FIG. 2.
Figure 10:
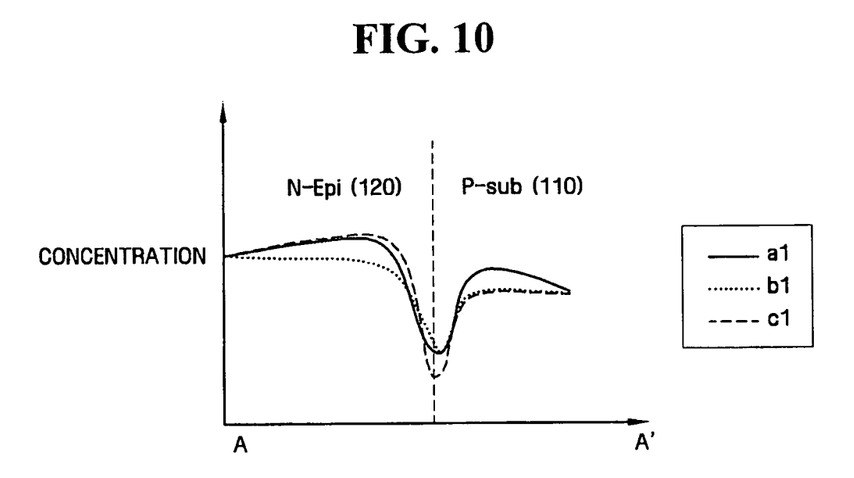
FIGS. 10 through 12 are graphs respectively illustrating concentration, quantity of charge, and electric field modeled along the line A-A' of FIG. 9.
Figure 11:
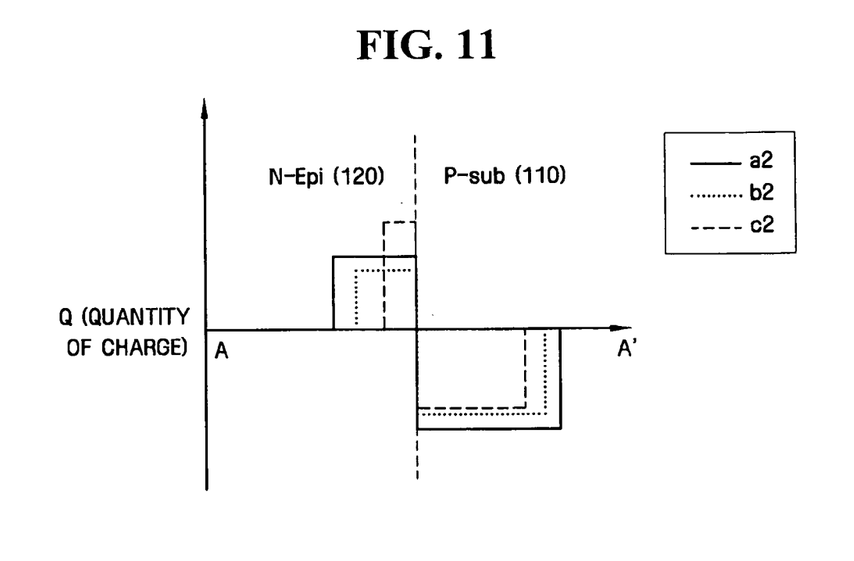
Figure 12:
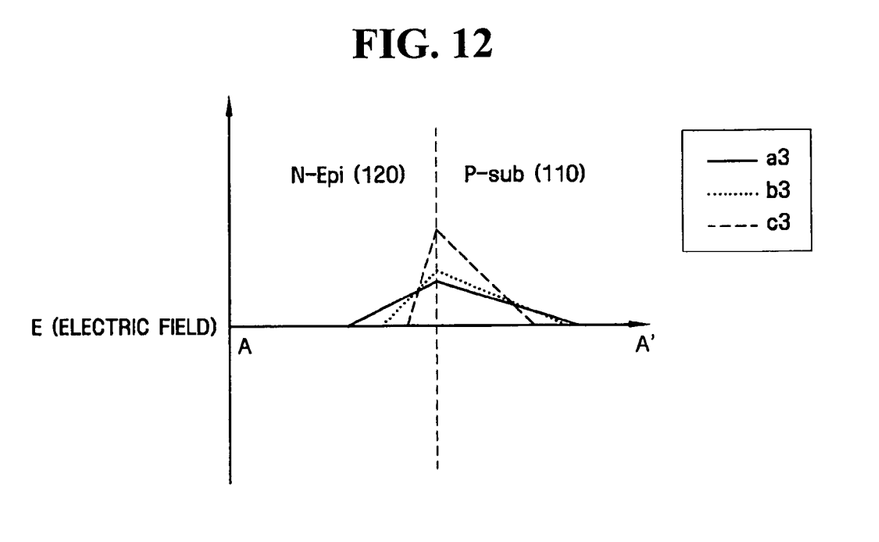

FIGS. 9 through 12 are diagrams for explaining effects of the exemplary embodiments of the present invention. FIGS. 10 through 12 are graphs respectively illustrating concentration, quantity of charge, and electric field modeled along the line A-A' of FIG. 9.

Referring to FIG. 9, a first diode D1 is formed between the first high-voltage well 146 and the epitaxial layer 120 in the first region I, and a second diode D2 is formed between the first high-voltage well 146 and the epitaxial layer 120 in the second region II. In addition, a third diode D3 is formed between the second high-voltage well 142 and the epitaxial layer 120, and a fourth diode D4 is formed between the substrate 110 and the epitaxial layer 120.

Here, the breakdown voltage of each of the first through fourth diodes D1 through D4 should always be higher than an operation voltage of a product.

The epitaxial layer 120 is formed at a high temperature of approximately 1000 to 1200 °C. Thus during the formation of the epitaxial layer 120, impurities 133 and 134 in the first buried impurity layer 132, the second buried impurity layers 130 and 131, and the third buried impurity layers 136 and 137 may move to the epitaxial layer 120. For example, the impurities 133 in the first buried impurity layer 132 may move to the epitaxial layer 120, or the impurities 134 in the second and third buried impurity layers 130, 131, 136 and 137 may move to the epitaxial layer 120. This phenomenon is referred to as an auto-doping phenomenon in the present specification. As shown in FIG. 9, impurities (e.g., arsenic) of the first conductivity type (the n type) exhibit high volatility and have a much higher concentration than impurities of the second conductivity type (the p type). Accordingly, the impurities of the first conductivity type can be easily diffused to the whole of the epitaxial layer 120.

The anti-doping phenomenon may lower the breakdown voltage of each of the first through third diodes D1 through D3. However, since the second buried impurity layers of the second conductivity type 130 and 131 are included in the semiconductor integrated circuit device according to the exemplary embodiment of the present invention, a drop in the breakdown voltage of each of the first through third diodes D1 through D3 can be reduced. This is because, as described above, impurities diffused to the epitaxial layer 120 are mostly the impurities (e.g., arsenic) of the first conductivity type, and the impurities of the first conductivity type are offset by the second buried impurity layers 130a and 131 of the second conductivity type.

Meanwhile, the higher the resistivity of the epitaxial layer 120, the higher the breakdown voltage of each of the first and second high-voltage transistors NLD and PLD. In addition, the thicker the epitaxial layer 120, the lower the breakdown voltage of the first high-voltage transistor NLD and the higher the breakdown voltage of the second high-voltage transistor PLD. In summary, the resistivity of the epitaxial layer 120 must be increased and the thickness of the epitaxial layer 120 must be reduced to raise the breakdown voltage of the first high-voltage transistor NLD. Also, the resistivity and thickness of the epitaxial layer 120 must be increased to raise the breakdown voltage of the second high-voltage transistor PLD.

The second buried impurity layer 131 of the second conductivity type is formed under the first high-voltage transistor NLD. As described above, the second buried impurity layer 131 of the second conductivity type is diffused to the epitaxial layer 120 of the first conductivity type (see FIG. 7), thereby reducing the substantial thickness of the epitaxial layer 120 of the first conductivity type. That is, the substantial thickness of the epitaxial layer 120 is smaller when the second buried impurity layers 130 and 131 of the second conductivity type are present than when the second buried impurity layers 130 and 131 of the second conductivity type are not present.

In addition, the impurities (e.g., arsenic) of the first conductivity type, which are diffused from the first buried impurity layer 132, are offset by the second buried impurity layers 130 and 131 of the second conductivity type. As a result, the resistivity of the epitaxial layer 120 is increased.

In particular, the gate electrode 182 and the second buried impurity layer 131 reduce a surface electric field. Since two elements, e.g., the gate electrode 182 and the second buried impurity layer 131 reduce the surface electric field, so it is referred to as a double reduced surface electric field (RESURF) in the present specification. When the semiconductor integrated circuit device operates, the epitaxial layer 120 is fully depleted. So it causes electric fields around the source 185 and the drain 184 to become similar and this enables the first high-voltage transistor NLD to obtain a high breakdown voltage. That is, the depletion of the fourth diode D4 is increased, and thus the semiconductor integrated circuit device according to the exemplary embodiment exhibits stable device characteristics.

The first buried layer 132 of the first conductivity type is formed under the second high-voltage transistor PLD. The first buried impurity layer 132 of the first conductivity type can raise the breakdown voltage of the second high-voltage transistor PLD.

The second buried impurity layer 130 disposed between the first buried impurity layer 132 and the third buried impurity layer 136 offsets the impurities 133 diffused from the first buried impurity layer 132, thereby raising the breakdown voltage of the first diode D1. That is, the second buried impurity layer 130 can increase the electrical isolation effect of the first high-voltage well 146 and the third buried impurity layer 136.

The second buried impurity layers 130 and 131 playing the above roles are formed by blank implantation. The use of masks requires a photolithography process which entails a complicated fabrication process and a higher fabrication cost. However, since no mask is used in blank implantation, the fabrication process is simplified, and the fabrication cost hardly increases.

The above description will be summarized with reference to FIGS. 10 through 12. Referring to FIGS. 10 through 12, a1 through a3 represent a case where the second buried impurity layers 130 and 131 are formed using the fabrication method of FIG. 2, b1 through b3 represent an ideal case where the autodoping phenomenon does not occur, and c1 through c3 represent a case where the second buried impurity layers 130 and 131 are not formed.

Referring to FIG. 10, the x-axis represents position along the line A-A' of FIG. 9, and the y-axis represents concentration. When the second buried impurity layers 130 and 131 are not present, impurities diffused from the first buried impurity layer 132 increase the concentration of the epitaxial layer 120 (see c1). On the other hand, when the second buried impurity layers 130 and 131 are present, impurities diffused from the first buried impurity layer 132 are offset by the second buried impurity layers 130 and 131. Thus, the concentration of the epitaxial layer 120 is not high (see a1).

Referring to FIG. 11, the x-axis represents position along the line A-A' of FIG. 9 and the y-axis represents quantity of charge. When the second buried impurity layers 130 and 131 are not present, electric charges are concentrated in the boundary region between the epitaxial layer 120 and the substrate 110 (see c2). On the other hand, when the second buried impurity layers 130 and 131 are present, electric charges are distributed over a large area along a vertical direction of the epitaxial layer 120 and the substrate 110 (see a2).

Referring to FIG. 12, the x-axis represents position along the line A-A' of FIG. 9, and the y-axis represents electric field. When the second buried impurity layers 130 and 131 are not present, a high electric field is formed in the boundary region between the epitaxial layer 120 and the substrate 110 (see c3). On the other hand, when the second buried impurity layers 130 and 131 are present, an electric field is formed over a large area along the vertical direction of the epitaxial layer 120 and the substrate 110 (see a3).

Figure 13:
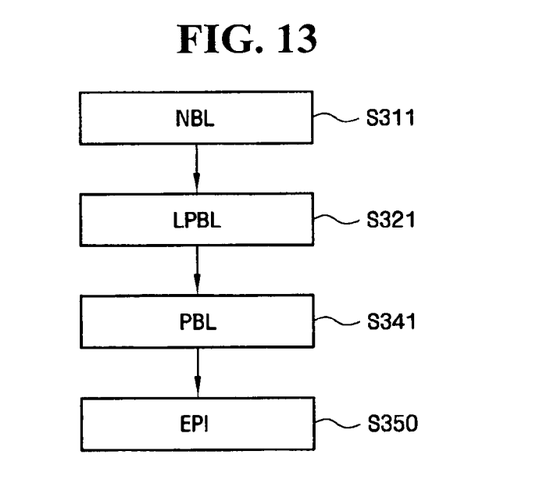
FIGS. 13 through 15 are flowcharts illustrating methods of fabricating a semiconductor integrated circuit device according to other exemplary embodiments of the present invention.
Figure 14:
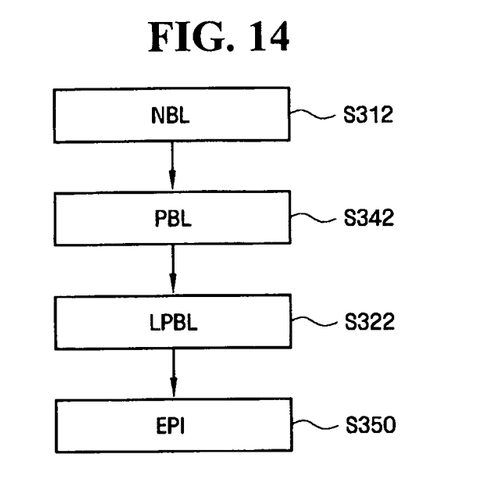
Figure 15:
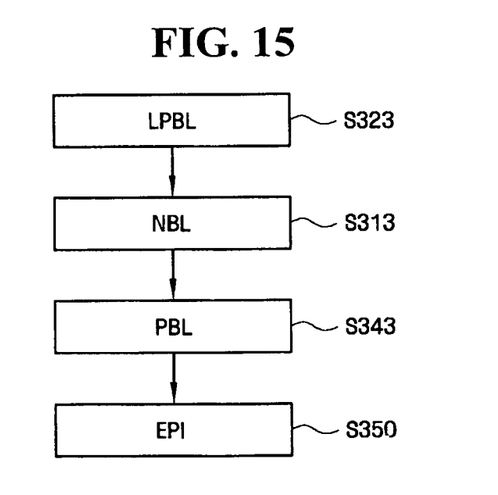

FIGS. 13 through 15 are flowcharts illustrating methods of fabricating a semiconductor integrated circuit device according to other exemplary embodiments of the present invention.

Referring to FIG. 13, a first buried impurity layer is formed (operation S311), a second buried impurity layer is formed (operation S321), a third buried impurity layer is formed (operation S341), and an epitaxial layer is formed (operation S350).

Referring to FIG. 14, a first buried impurity layer is formed (operation S312), a third buried impurity layer is formed (operation S342), a second buried impurity layer is formed (operation S322), and an epitaxial layer is formed (operation S350).

Referring to FIG. 15, a second buried impurity layer is formed (operation S323), a first buried impurity layer is formed (operation S313), a third buried impurity layer is formed (operation S343), and an epitaxial layer is formed (operation S350).

In the fabrication methods of FIGS. 13 through 15, the second buried layer may be formed by blank implantation.

In the fabrication methods of FIGS. 13 through 15, a passivation layer (indicated by reference numeral 222 in FIG. 4) is not formed by oxidation (see operation S320 in FIG. 2). The passivation layer protects the first buried impurity layer and prevents penetration of impurities used in blank implantation into the first buried impurity layer. Since the passivation layer is not formed in the exemplary embodiments of the present invention, the impurities used in the blank implantation penetrate into the first buried impurity layer. That is, the first and second buried impurity layers may overlap each other. However, since the concentration of the first buried impurity layer is far higher than that of the second buried impurity layer, characteristics of the first buried impurity layer may not change greatly.

The present invention is not limited to the description of FIGS. 13 through 15. For example, the third buried impurity layer may be formed before the first buried impurity layer and the second buried impurity layer.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of fabricating a semiconductor integrated circuit device, the method comprising:

forming a mask film, which exposes a portion of a substrate, on the substrate;

forming a first buried impurity layer, which contains impurities of a first conductivity type and of a first concentration, in a surface of the exposed portion of the substrate by using the mask film;

removing the mask film;
forming a second buried impurity layer, which contains impurities of a second conductivity type and of a second concentration, using blank implantation; and
forming an epitaxial layer on the substrate having the first and second buried impurity layers,
wherein the first concentration is higher than the second concentration.

2. The method of claim 1, further comprising forming a passivation layer on the first buried impurity layer, wherein blank implantation is performed after the passivation layer is formed on the first buried impurity layer.

3. The method of claim 2, wherein in the forming of the passivation layer, the passivation layer is formed by oxidation.

4. The method of claim 1, further comprising forming a third buried impurity layer, which is separated from the first buried impurity layer, overlaps the second buried impurity layer and contains impurities of the second conductivity type and of a third concentration, between the forming of the second buried impurity layer and the forming of the epitaxial layer, wherein the third concentration is higher than the second concentration.

5. The method of claim 4, further comprising forming a first high-voltage transistor of the first conductivity type on the epitaxial layer after the forming of the epitaxial layer, wherein a source of the first high-voltage transistor is formed in a first high-voltage well of the second conductivity type which is formed in the epitaxial layer, and the first high-voltage well and the third buried impurity layer contact each other.

6. The method of claim 1, further comprising forming a second high-voltage transistor of the second conductivity type on the epitaxial layer after the forming of the epitaxial layer, wherein the second high-voltage transistor comprises a drift region and a channel region formed between a source and a drain thereof.

7. The method of claim 6, wherein the drift region and the first buried impurity layer are separated from each other.

8. The method of claim 1, wherein the first conductivity type is an n type, and the second conductivity type is a p type.

9. The method of claim 1, wherein the impurities of the first conductivity type are arsenic, and the impurities of the second conductivity type are boron.

10. A method of fabricating a semiconductor integrated circuit device, the method comprising:
preparing a substrate in which a first region and a second region are defined;
foaming a first buried impurity layer of a first conductivity type, a second buried impurity layer of a second conductivity type which is different from the first conductivity type, and a third buried impurity layer of the second conductivity type in a surface of the substrate; and
forming an epitaxial layer on the substrate having the first through third buried impurity layers,
wherein the first buried impurity layer is formed in the first region, the third buried impurity layer is formed in the second region, and the second buried impurity layer overlaps the third buried impurity layer.

11. The method of claim 10, wherein the second buried impurity layer has a lower concentration than the first and third buried impurity layers.

12. The method of claim 10, wherein the second buried impurity layer is formed by blank implantation.

13. The method of claim 10, wherein the second buried impurity layer overlaps the first buried impurity layer.

14. The method of claim 10, wherein the forming of the first through third buried impurity layers comprises:
forming the first buried impurity layer in the first region;
forming the second buried impurity layer in the first and second regions by using blank implantation; and
forming the third buried impurity layer in the second region.

15. The method of claim 14, further comprising forming a passivation layer on the first buried impurity layer, wherein blank implantation is performed after the passivation layer is formed on the first buried impurity layer.

16. The method of claim 10, wherein the forming of the first through third buried impurity layers comprises:
forming the first buried impurity layer in the first region;
forming the third buried impurity layer in the second region; and
forming the second buried impurity layer in the first and second regions by using blank implantation.

17. The method of claim 10, wherein the forming of the first through third buried impurity layers comprises:
forming the second buried impurity layer in the first and second regions by using blank implantation;
forming the first buried impurity layer in the first region; and
forming the third buried impurity layer in the second region.

18. The method of claim 10, wherein the first region is a region where a high-voltage transistor of the second conductivity type is formed, and the second region is a region where a high-voltage transistor of the first conductivity type is formed.

* * * * *